United States Patent [19]
Aslan

[11] Patent Number: 6,154,178
[45] Date of Patent: Nov. 28, 2000

[54] ULTRA WIDEBAND PERSONAL ELECTROMAGNETIC RADIATION MONITOR

[75] Inventor: Edward E. Aslan, Plainview, N.Y.

[73] Assignee: L3 Communications Corporation, New York, N.Y.

[21] Appl. No.: 09/210,285

[22] Filed: Dec. 11, 1998

[51] Int. Cl.$^7$ .................................................. H01Q 1/12
[52] U.S. Cl. ........................................ 343/718; 340/600
[58] Field of Search .................................... 343/703, 718, 343/894; 324/95, 106, 72.5, 119; 455/67; 340/600, 573; 250/370, 392, 526, 395

[56] References Cited

U.S. PATENT DOCUMENTS

| | | | |
|---|---|---|---|
| 3,641,439 | 2/1972 | Aslan | 325/363 |
| 3,794,914 | 2/1974 | Aslan | 324/95 |
| 4,301,367 | 11/1981 | Hsu | 250/370 |
| 4,489,315 | 12/1984 | Falk et al. | 340/600 |
| 4,605,905 | 8/1986 | Aslan | 330/9 |
| 4,629,978 | 12/1986 | Aslan | 324/95 |
| 4,634,968 | 1/1987 | Aslan | 324/95 |
| 5,057,848 | 10/1991 | Rankin et al. | 343/703 |
| 5,373,284 | 12/1994 | Aslan | 340/600 |
| 5,373,285 | 12/1994 | Aslan | 340/600 |
| 5,576,696 | 11/1996 | Adler | 340/600 |
| 5,600,307 | 2/1997 | Aslan | 340/600 |

FOREIGN PATENT DOCUMENTS

| | | |
|---|---|---|
| 3606326 A1 | 9/1987 | Germany . |
| 803792 | 11/1958 | United Kingdom . |
| 998779 | 7/1965 | United Kingdom . |
| 2194865 | 3/1988 | United Kingdom . |
| WO 85/01358 | 3/1985 | WIPO . |

OTHER PUBLICATIONS

Tofani et al., "Induced Foot–Currents in Humans Exposed to VHF Radio–Frequency EM Fields", *IEEE Transactions on Electromagnetic Compatability*, vol. 37, No. 1, Feb. 1995, pp. 96–99.

Jokela, et al., "Radio Frequency Currents Induced in the Human Body for Medium–Frequency/High–Frequency Broadcast Antennas", *Health Physics*, vol. 66, No. 3, Mar. 1994, pp. 237–244.

Reno, "Microwave Reflection, Diffraction and Transmission Studies of Man", Naval Aerospace Medical Research Laboratory, No. AD–780 226, Feb. 7, 1974, pp. 1–39.

Wolff, *Antenna Analysis*, John Wiley & Sons, Inc., p. 27. (date is not available).

Jordan, et al., *Electromagnetic Waves and Radiating Systems*, Prentice–Hall, Inc., pp. 333–337. (dates not available).

Korniewicz, "The First Resonance of a Grounded Human Being Exposed to Electric Fields", *IEEE Transactions of Electromagnetic Compatability*, vol. 37, No. 2, May 1995, pp. 296–299., 1995.

Gandhi, et al., "Currents Induced in a Human Being for Plane–Wave Exposure Conditions 0–50 MHz and for RF Sealers", *IEEE Transactions on Biomedical Engineering*, vol. BME–33, No. 8, Aug. 1986, pp. 757–767.

Dorf, *Electrical Engineering Handbook*, CRC Press, 1993, pp. 620–694. (Date is not available).

*Primary Examiner*—Tan Ho
*Attorney, Agent, or Firm*—Hoffman & Baron, LLP

[57] ABSTRACT

The electromagnetic radiation monitor includes a low frequency surface charge sensor, a high frequency sensor, and a lossy material sandwiched between the two sensors. The surface charge sensor responds to electromagnetic radiation from about 100 KHz to about 1 GHz. The high frequency sensor responds to frequencies from about 300 MHz to about 100 GHz. An output signal from the low frequency sensor is detected, and provided to an adjustable gain amplifier. An output signal from the high frequency sensor is similarly provided to a second adjustable gain amplifier. Output signals from the two amplifiers are summed by a summing circuit, whose output signal is provided to one input of a comparator circuit. The output signal from the comparator circuit triggers an audible or visible alarm from the alarm circuit when electromagnetic radiation detected by either or both of the low and high frequency sensors causes the output signal of the summer circuit to exceed a threshold.

24 Claims, 12 Drawing Sheets

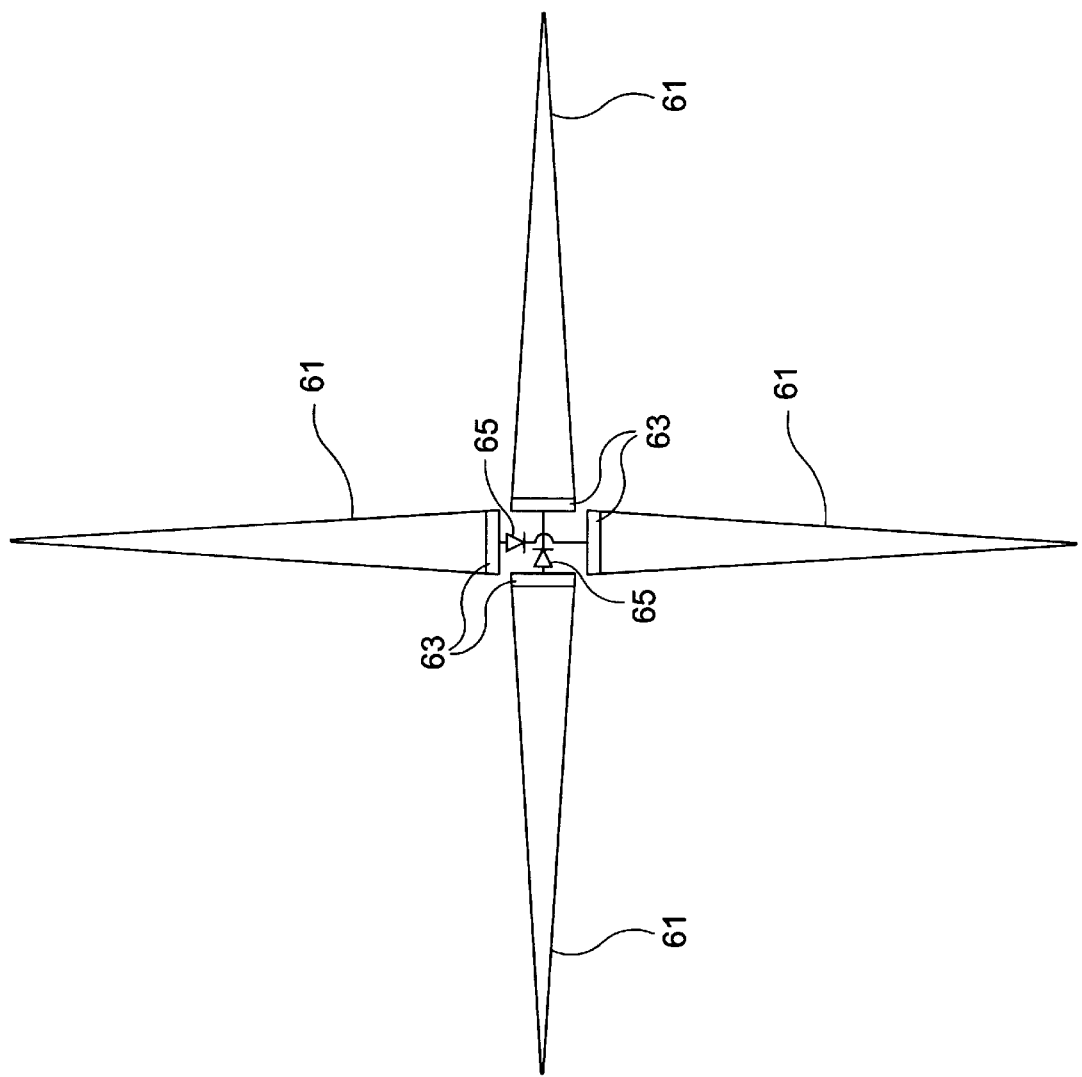

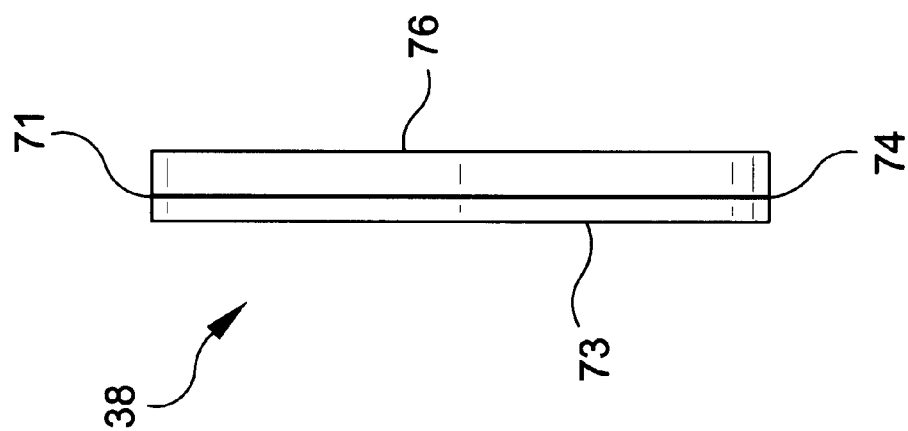
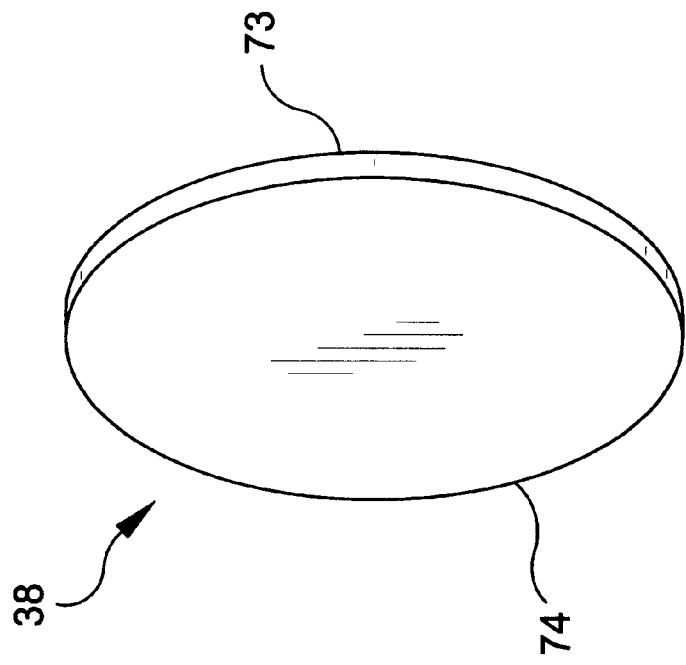

ULTRA WIDEBAND PERSONAL ELECTROMAGNETIC RADIATION MONITOR

BACKGROUND OF THE INVENTION

1. Field of the Invention

This invention relates to radiation monitors, and more specifically relates to an electromagnetic radiation monitor which may be worn by persons exposed to potentially harmful levels of electromagnetic radiation over an extremely wide bandwidth of about 100 kHz to about 100 GHz.

2. Description of the Prior Art

Workers often find themselves laboring under conditions in which there is a danger of being exposed to radiation over a very wide bandwidth. The majority of personal radiation monitors of the prior art are effective only within a kilohertz (kHz), Megahertz (MHZ), or Gigahertz (GHz) range; a predetermined high frequency range or a predetermined low frequency range. Attempts to fabricate radiation monitors with a capability of detecting electromagnetic radiation spanning two or more of these ranges has met with great difficulty in the past. In part, this difficulty is due to interference between various high and low frequency components of the monitor that detect different bands of frequency within the desired bandwidth. An additional difficulty inherent in such wideband radiation monitors, is that scattering from the person wearing the monitor and components of the monitor itself can produce errors of greater than two decibels (dB).

Currently, no practical device independent of polarization and responsive to electromagnetic radiation having a frequency range of about 100 kHz to about 100 GHz is available to the knowledge of the inventor.

OBJECTS AND SUMMARY OF THE INVENTION

It is an object of the present invention to provide a personal electromagnetic radiation monitor responsive to electromagnetic radiation in the frequency range of about 100 kHz to about 100 GHz.

It is yet another object of the present invention to provide an electromagnetic radiation monitor which may be worn by persons who are exposed to harmful levels of electromagnetic energy.

It is yet a further object of the present invention to provide a personal electromagnetic radiation monitor that enables electronic circuitry in the monitor to operate when surrounded by high levels of electromagnetic radiation with a low probability of false alarms caused by radiation outside the desired bandwidth.

It is another object of the present invention to provide a personal electromagnetic radiation monitor which complies with the ANSI (American National Standards Institute) and IEEE (Institute of Electronic and Electrical Engineers) or alternative similar national radiation hazard standards.

It is yet another object of the present invention to provide a personal electromagnetic radiation monitor whose performance in one portion of a desired frequency band is not substantially degraded by components of the monitor used for detecting electromagnetic radiation in another portion of the desired frequency band.

It is still a further object of the present invention to provide a practical, lightweight, pocket-sized personal electromagnetic radiation monitor which accurately detects electromagnetic radiation and provides a warning to the wearer of hazardous electromagnetic radiation.

It is another object of the present invention to define an electromagnetic radiation meter for measuring an electric field component of the electromagnetic radiation or an electric field induced in the person exposed to the electromagnetic radiation.

It is yet another object of the present invention to provide a personal electromagnetic radiation monitor which is operable over a very broad range of frequencies and over a wide range of distances from a source of electromagnetic radiation.

It is still a further object of the present invention to provide a personal electromagnetic radiation monitor which exhibits wideband frequency performance substantially independent of polarization.

In accordance with the present invention, a personal electromagnetic radiation monitor is provided, which detects both low and high frequency electromagnetic radiation. The electromagnetic radiation monitor includes a sensor assembly of basically three components: a low frequency sensor; a high frequency sensor; and a lossy material sandwiched between the two sensors.

The low frequency sensor in one form of the present invention includes a round, partially resistive or substantially conductive (e.g., metallic) disk. The disk acts as an electric field surface charge sensor. The high frequency sensor is preferably a planar array of spaced apart thermocouples, but may be a planar arrangement of resistive dipoles. The lossy material, interposed between the two sensors, may be formed from a material having a predetermined impedance per square, or may be graduated in conductivity through its thickness, the more conductive portion being nearer the low frequency sensor. The impedance of the lossy material and high frequency sensor is significantly higher than the impedance of the disk of the low frequency surface charge sensor and, therefore, does not significantly affect its operation.

The surface charge low frequency sensor responds to electromagnetic radiation from about 100 KHz to about 1 GHz (above about 300 MHZ, the response of the low frequency sensor falls off to where it is negligible above about 1 GHz). The thermocouple high frequency sensor responds to frequencies from about 300 MHZ to about 100 GHz (its response falls off below about 1000 MHZ and is negligible below about 300 MHZ). Both sensors respond in the region between about 300 MHZ and about 1 GHz.

The output signal from the low frequency sensor is provided to a detector circuit, such as a diode detector (or other square law device), and the output signal from the detector is provided to an adjustable gain amplifier. The output signal from the high frequency sensor is similarly provided to a second adjustable gain amplifier. The output signals of the two amplifiers, independently adjusted in amplitude for proper threshold control, are summed by a summing circuit, whose output signal is provided to one input of a comparator circuit. The other input of the comparator circuit is connected to an adjustable threshold voltage.

The output signal from the comparator circuit is provided to an alarm circuit. The output signal from the comparator circuit will trigger an audible or visible alarm from the alarm circuit when electromagnetic radiation detected by either or both of the low and high frequency sensors causes the output signal of the summer circuit to exceed the threshold.

These and other objects, features and advantages of the present invention will become apparent from the following detailed description of illustrative embodiments thereof, which is to be read in conjunction with the accompanying drawings.

BRIEF DESCRIPTION OF THE DRAWINGS

FIG. 4A is a pictorial view of a second embodiment of the high frequency sensor used in the personal electromagnetic radiation monitor formed in accordance with the present invention utilizing resistive dipoles.

FIG. 5 is a side pictorial view of a first embodiment of a low frequency surface charge sensor formed in accordance with the present invention.

FIG. 6 is a side pictorial view of a second embodiment of the low frequency surface charge sensor formed in accordance with the present invention.

DETAILED DESCRIPTION OF THE PREFERRED EMBODIMENTS

Figure 1:
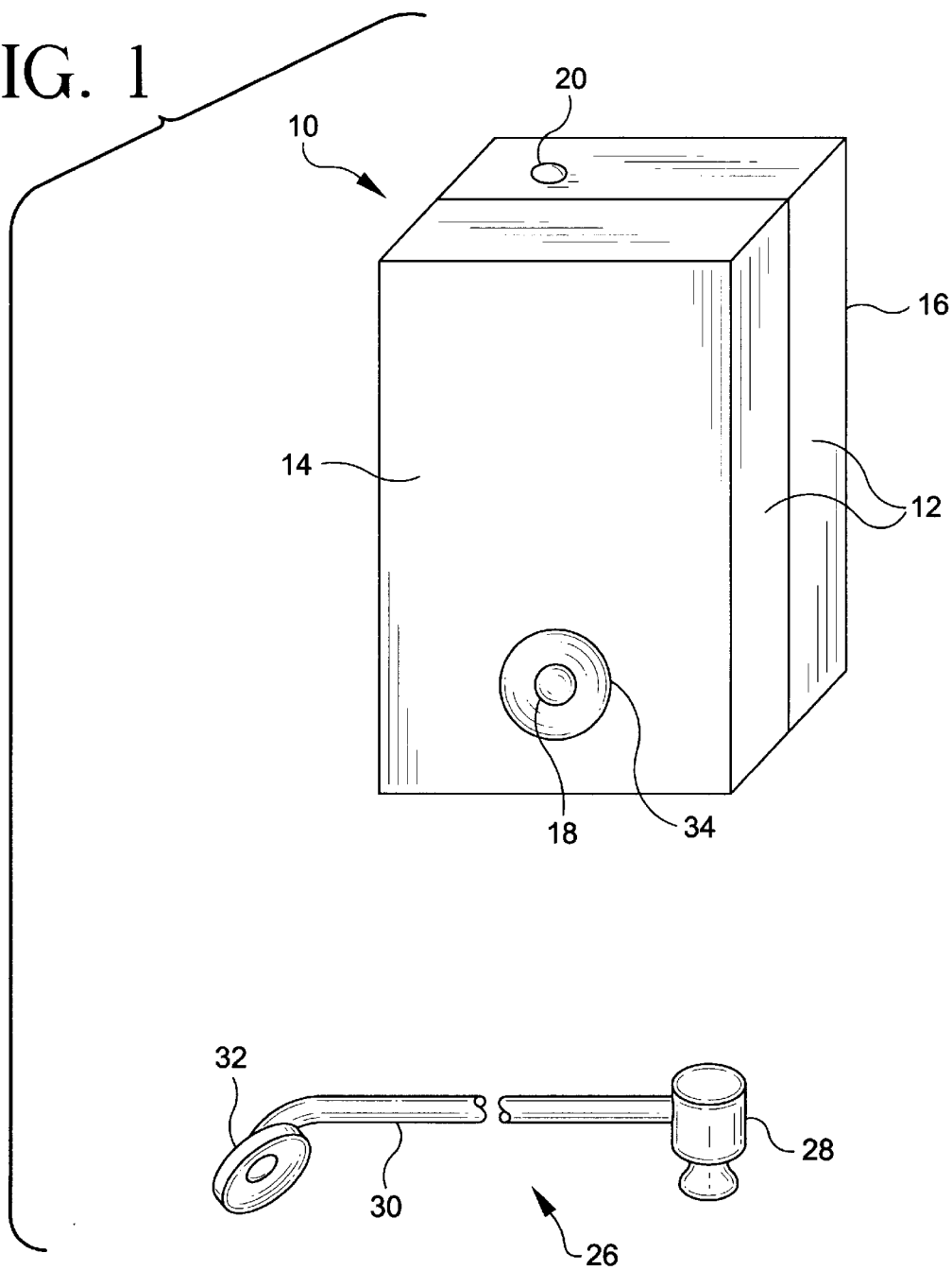
FIG. 1 is a front pictorial view of a personal electromagnetic radiation monitor and ear plug assembly formed in accordance with the present invention.
Figure 2:
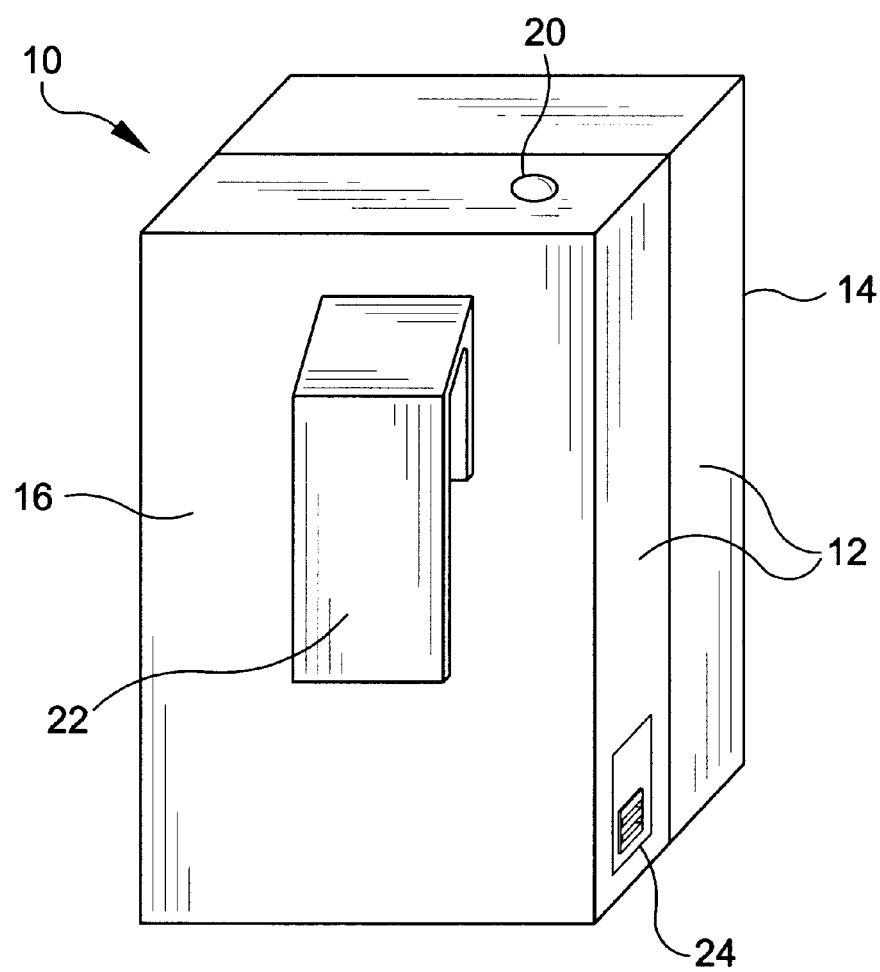
FIG. 2 is a rear pictorial view of the personal electromagnetic radiation monitor formed in accordance with the present invention.

FIGS. 1 and 2 illustrate an external view of the personal electromagnetic radiation monitor 10 of the present invention. The personal electromagnetic radiation monitor 10 is constructed from a two-piece housing 12 including a front housing 14 and a rear housing 16. An audible alarm indicator 18, such as a piezoelectric speaker is mounted on the front housing 14. The audible alarm indicator 18 indicates dangerous levels of electromagnetic radiation using variable tones and repetition rates to represent various different levels of electromagnetic radiation. The audible alarm indicator 18 also indicates such conditions as low battery voltage and an initial power-on self test.

A visual alarm indication device 20, such as a light emitting diode (LED), is also included in the personal electromagnetic radiation monitor 10, which indicates dangerous levels of radiation and such conditions as low battery voltage and the initial power-on self test. Upon detection of a predetermined level of radiation, the personal electromagnetic radiation monitor 10 warns the wearer to relocate to a different area until the audible and visual alarm indicators no longer indicate hazardous levels of radiation.

A clothing clip 22 is affixed to the rear housing 16 of the two-piece housing 12 to allow the wearer to position the personal electromagnetic radiation monitor 10 on an article of clothing. A power switch 24 mounted on the two-piece housing 12 enables conservation of battery or alternative power sources for the personal electromagnetic radiation monitor during periods of inactivity.

The two piece housing 12 provides for a battery enclosure (not shown), which holds batteries for the personal electromagnetic radiation detector 10. The battery enclosure and the audible alarm indication device 18 are preferably at least partially surrounded by lossy material which functions to limit the effect of electromagnetic radiation on the audible alarm indication device 18 and batteries as well as reducing the probability of false alarms. The term "lossy" refers to a medium which absorbs or scatters radiation passing through it.

The personal electromagnetic radiation monitor 10 also includes an ear plug assembly 26, which permits the monitor 10 to be heard by the wearer in noisy environments. The ear plug assembly 26 includes an ear plug 28, a mating assembly 32 and a tube 30 connecting the ear plug 28 with the mating assembly 32. The ear plug 28 is placed in the wearer's ear and the tube 30 provides a pneumatic channel from the audible alarm indication device 18 to the ear plug 28. The pneumatic channel enables sound emitted by the audible alarm indication device 18 to be carried via fluctuations in air pressure to the wearer's ear. The mating assembly 32 includes a fastening area 34 such as a hook and loop fastener to ensure that one end of the tube 30 is maintained in close proximity with the audible alarm indication device 18. An alternative ear plug assembly suitable for use in the present invention is disclosed in U.S. Pat. No. 5,168,265, which is incorporated herein by reference.

The use of the pneumatic ear plug assembly 26 is advantageous in that it is electrically non-conductive. Electrical non-conductivity ensures that the ear plug assembly 26 does not transfer energy from the environment to the wearer. In addition, the pneumatic ear plug assembly 26 does not pose an electrical shock hazard to the wearer.

Figure 3:
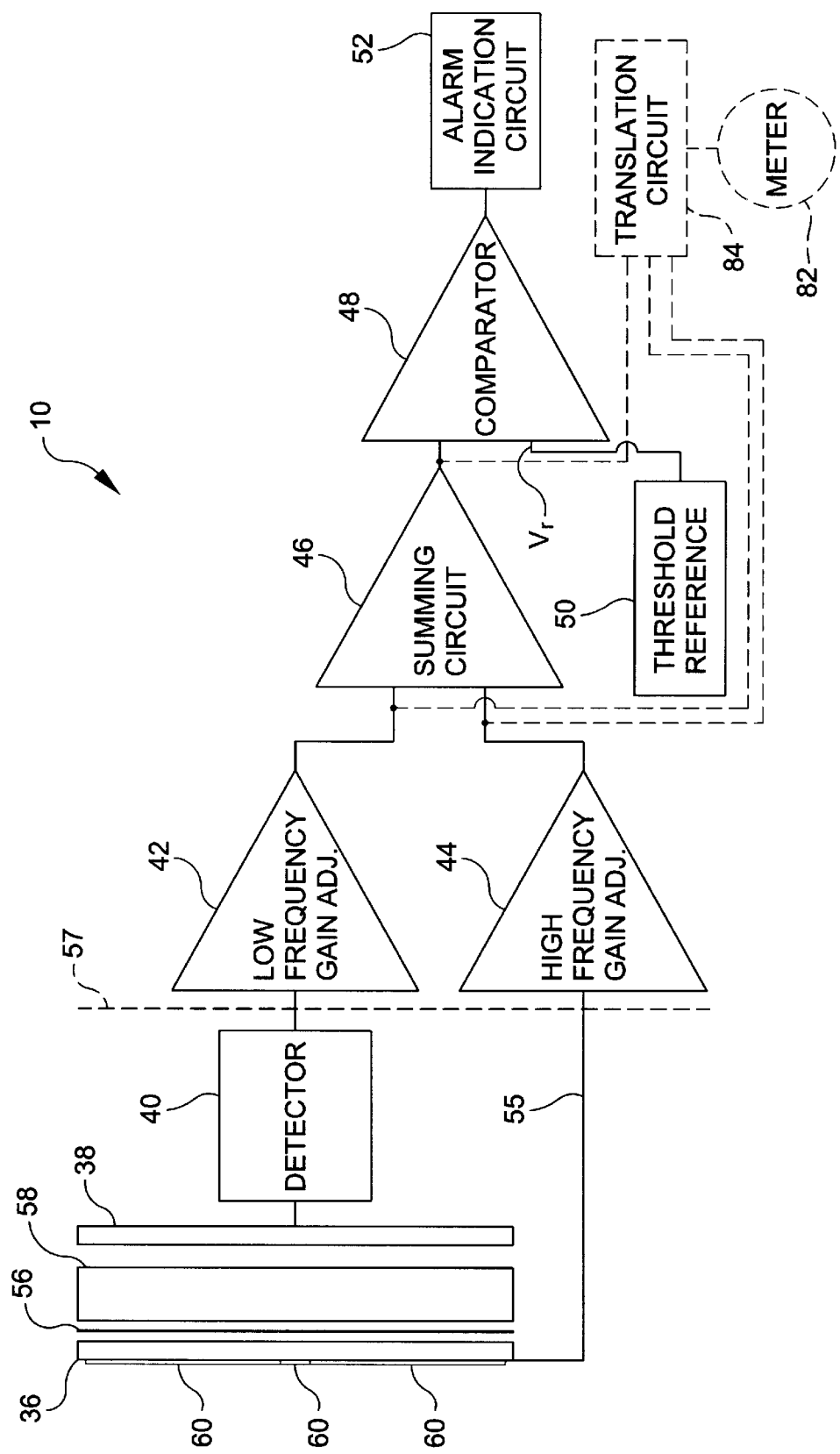
FIG. 3 is a block diagram of the personal electromagnetic radiation monitor formed in accordance with the present invention.

FIG. 3 illustrates a block diagram of several components of the personal electromagnetic radiation monitor 10, which are enclosed within the two-piece housing 12 illustrated in FIGS. 1 and 2. The personal electromagnetic radiation monitor 10 includes a high frequency sensor 36, an optional non-conductive insulation sheet 56 mounted behind the high frequency sensor 36, a lossy material 58 disposed behind the non-conductive insulation sheet 56 and in front of the low frequency sensor 38, the low frequency or surface charge sensor 38 in close proximity to the high frequency sensor 36, a detector 40 coupled to (and preferably located under) the low frequency sensor 38, a low frequency gain adjustment circuit 42 coupled to the output of detector 40, a high frequency gain adjustment circuit 44 coupled to the high frequency sensor 36, a summing circuit 46 coupled to the outputs of low frequency gain adjustment circuit 42 and the high frequency gain adjustment circuit 44, a comparator 48 having one of its inputs coupled to the summing circuit 46, a threshold reference 50 coupled to the other input of comparator 48, and an alarm indication device or circuit 52 coupled to the output of comparator 48. The lossy material 58 is preferably sandwiched between the high frequency sensor 36 and the low frequency sensor 38. The optional non-conductive insulation sheet 56 is preferably sandwiched between the lossy material 58 and the high frequency sensor 36.

Figure 4:
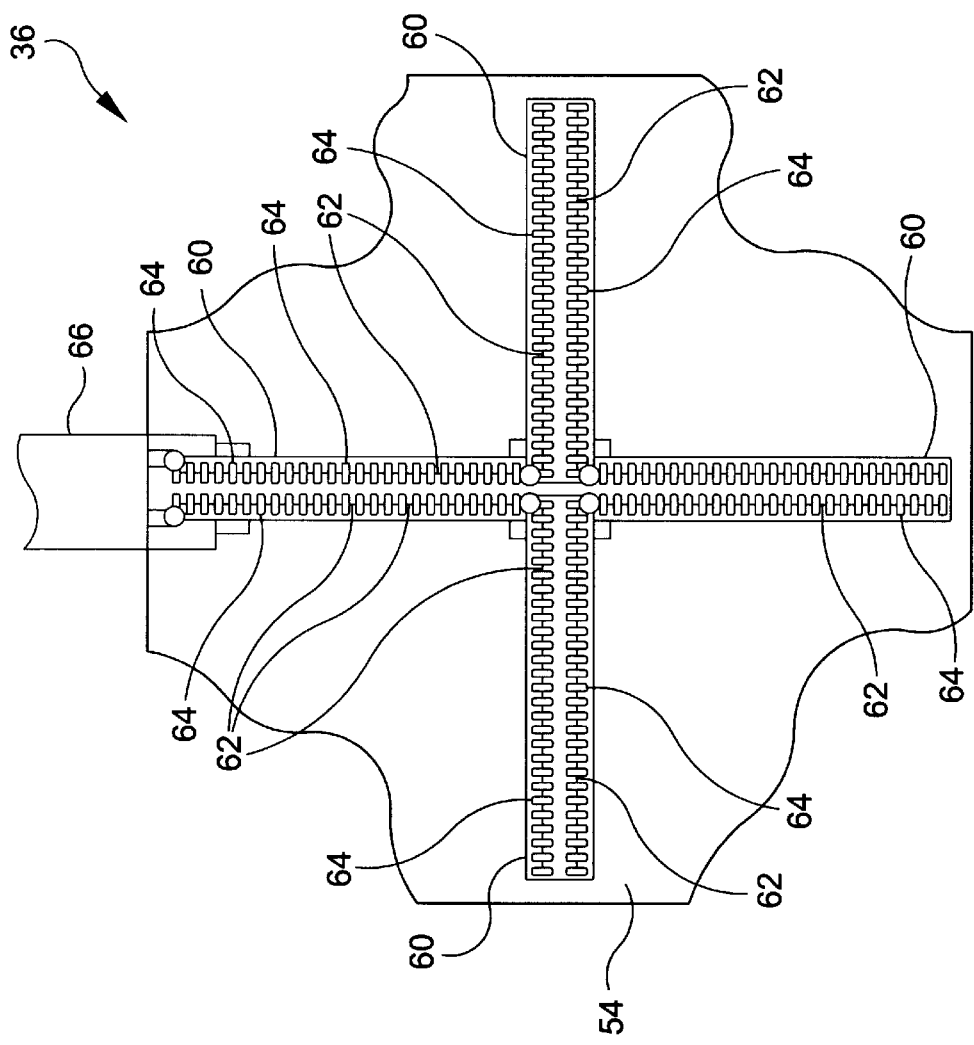
FIG. 4 is a pictorial view of a first embodiment of a high frequency sensor used in the personal electromagnetic radiation monitor formed in accordance with the present invention utilizing thermocouples.

The high frequency sensor 36 preferably includes an orthogonal planar array of thin film resistive thermocouples. In one embodiment of the high frequency sensor 36, two antenna elements are disposed orthogonally in a plane. FIG. 4 illustrates a preferred embodiment of the high frequency sensor 36, which includes four antenna elements 60 disposed in a plane. Each antenna element 60 includes a longitudinal axis, which is oriented at substantially 90 degrees relative to the longitudinal axis of adjacent antenna elements 60. Each antenna element 60 has an array of thin film resistive thermocouples 62 positioned along its respective longitudinal axis, and conductive elements 64 arranged perpendicularly to the longitudinal axis and spaced apart from each other. The thin film resistive thermocouples 62 of the antenna elements 60 are positioned between adjacent conductive elements 64. A similar antenna design is disclosed in U.S. Pat. No. 4,518,912, which is incorporated herein by reference. The thin film resistive thermocouples 62 include hot and cold junctions (not shown), which are spaced about 0.5 mm apart. The hot and cold junctions essentially remove offsets caused by changes in ambient temperature. The thin film resistive thermocouples 62 function as an antenna and a detector of wideband, relative high frequency electromagnetic radiation.

Alternatively, the high frequency sensor 36 can include resistive dipoles 61, which are tapered as shown in FIG. 4A or straight (not shown). The resistive dipoles 61 preferably have silver terminals 63 and are preferably about 100 ohms to about 10,000 ohms depending upon the frequency and field strength being monitored. The silver terminals 63 of opposing resistive dipoles 61 are coupled via a series configuration, as shown in FIG. 4A, or a parallel configuration (not shown) of diodes 65.

Referring again to FIG. 3, the non-conductive insulation sheet 56 is mounted between the high frequency sensor 36 and the lossy material 58 to prevent electrical conductivity between the high frequency sensor 36, and the low frequency sensor 38. The non-conductive insulation sheet 56 is preferably manufactured from Mylar™ or Kapton™.

The lossy material 58 can be of substantially constant conductivity or may be graduated in conductivity through its thickness from the high frequency sensor 36 towards the low frequency sensor 38. If graduated, the lossy material 58 is less conductive on a front face nearest the high frequency sensor 36 and progressively increases in conductivity as the thickness of the lossy material 58 is traversed towards the low frequency sensor 38.

In one embodiment the lossy material 58 includes a lamination of multiple layers of lossy material having different conductivities. If two laminated layers are used for the lossy material 58, the layers are preferably about a quarter of an inch thick. The layer nearest the high frequency sensor 36 preferably has a relatively lower conductivity or higher resistivity of about 15k ohms per cubic centimeter and about 20,000 ohms per square centimeter. The second layer nearest the low frequency sensor 38 preferably has a relatively higher conductivity or lower resistivity of about 600 ohms per cubic centimeter or about 2,000 ohms per square centimeter. In another embodiment, the lossy material 58 includes a substantially continuous progression or gradient of conductivity through the thickness of the lossy material 58.

The surface of the lossy material 58 nearest the high frequency sensor 36 has a higher resistivity than the surface of the lossy material 58 nearest the low frequency sensor 38 such that the lossy material 58 becomes more conductive as the electric field progresses from the high frequency sensor 36 to the low frequency sensor 38. Thus, the lossy material 58 is terminated by the surface nearest the low frequency sensor 38 having the greatest conductivity. The distributed resistance of the high frequency sensor 36 in combination with the lossy material 58 of optionally graduated resistivity, enhances operation of the high frequency sensor 36 over a wide bandwidth.

Referring again to FIG. 3, the high frequency sensor 36 is electrically connected to the high frequency gain adjustment circuit 44 by a flexible transmission line 55 including at least two leads (not shown). A conductive sheet 57 is disposed between the high frequency sensor 36 and the high frequency gain adjustment circuit 44 to shield remaining circuitry from the high frequency sensor 36. The leads conduct a dc voltage from the high frequency sensor 36 to the high frequency gain adjustment circuit 44, and preferably have a resistivity of about 500 ohms per square (e.g., ohms per square inch, ohms per square centimeter, ohms per square meter) for a total resistance per lead of about 150,000 ohms. As illustrated in FIG. 4, the leads 66 are preferably connected to one of the antenna elements 60 at opposing conductive elements 64, which are typically located at a peripheral end of the antenna elements 60. The high frequency gain adjustment circuit 44 in FIG. 3 can be implemented using a wide variety of configurations of operational amplifiers and transistors well known in the art, which are described in detail in R. Dorf, *Electrical Engineering Handbook* (1993), pp. 619–694, which is incorporated herein by reference. Preferably, circuit 44 is an adjustable gain amplifier. The high frequency gain adjustment circuit 44 provides independent gain adjustment and, thus, sensitivity to high frequencies of between about 300 MHZ to about 100 GHz.

The low frequency sensor 38 illustrated in FIG. 3 may be at least partially resistive or substantially conductive, and is positioned behind the lossy material 58.

Figure 10:
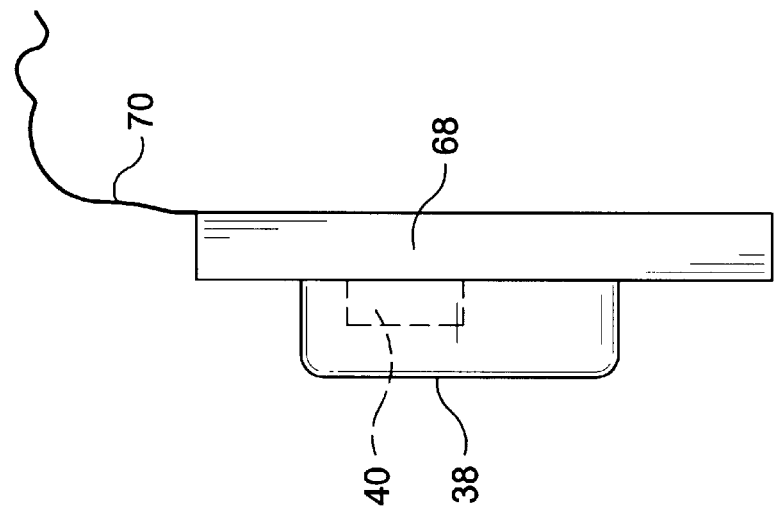
FIG. 10 is a side pictorial view of the low frequency surface charge sensor, the detector, the printed circuit board and the flexible transmission line formed in accordance with the present invention.
Figure 9:
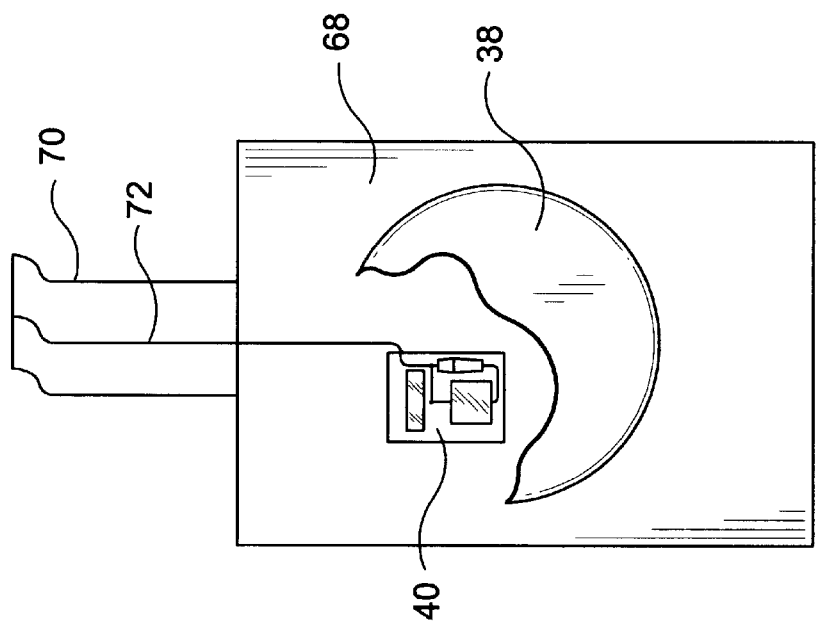
FIG. 9 is a front pictorial view of the low frequency surface charge sensor, a detector, a printed circuit board and a flexible transmission line formed in accordance with the present invention.

The low frequency sensor 38 functions as a conductive shield for the high frequency sensor 36 to enhance immunity of the personal electromagnetic radiation monitor 10 from scattering caused by the body of the wearer. As illustrated in FIGS. 9 and 10, the low frequency sensor 38 is preferably mounted together with the detector 40 on a printed circuit board 68. As shown in FIG. 3, the conductive sheet 57 is also disposed between the low frequency sensor 38 and the low frequency gain adjustment circuit 44 to shield remaining circuitry from the low frequency sensor 38. The output of the detector 40 is electrically connected to the low frequency gain adjustment circuit 42 with a second flexible transmission line 70 including a second lead 72 as shown in FIGS. 9 and 10. The second lead 72 preferably has a resistivity of about 500 ohms per square (e.g.,ohms per square inch, ohms per square centimeter, ohms per square meter) for a total resistance per lead of about 80 k ohms. The second flexible transmission line 70 may include a ground lead (not shown) which is positioned alongside the second lead 72, which functions as a ground connection for both the detector 40 and any remaining circuitry.

Figure 13:
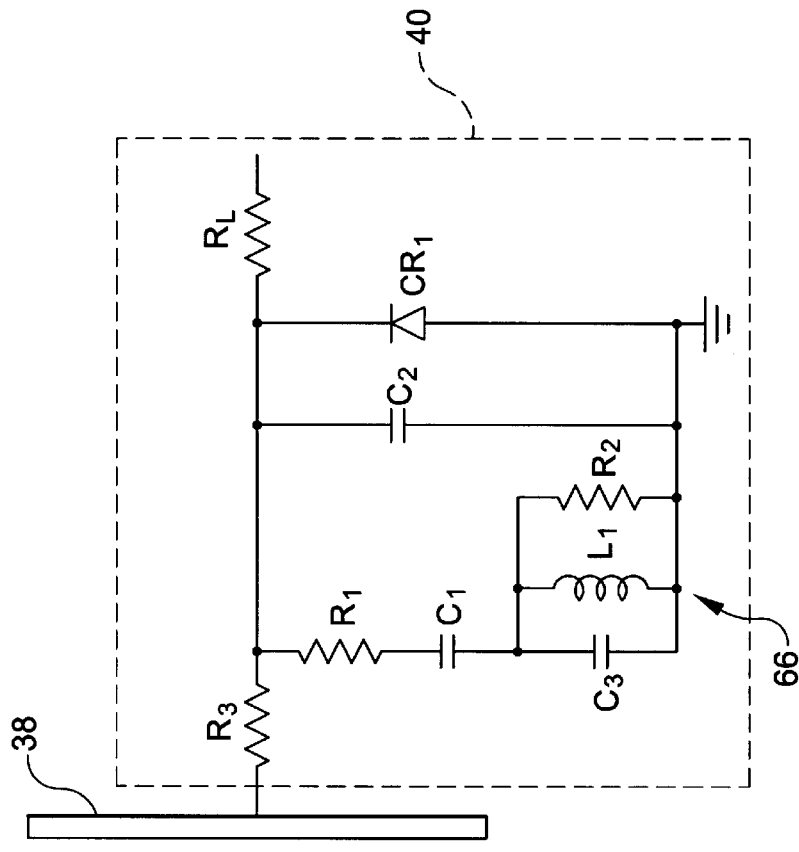
FIG. 13 is a schematic diagram of the low frequency surface charge sensor and a second embodiment of the detector formed in accordance with the present invention.

The low frequency sensor 38 can be flat or cup shaped. The cup-shape of the low frequency sensor 38 enables a quasi-isotropic response to radiation. FIG. 5 illustrates the flat embodiment of the low frequency sensor 38 in the form of a disk 74 including two substantially conductive (e.g., metal) plates 73 separated by a dielectric 71 having a capacitance of about 50 pF to about 80 pF. The flat embodiment enables the personal electromagnetic radiation monitor to respond primarily to the radial field component of the radiation. A resistor R3, as shown in FIG. 13, may be added to limit or modify the response of the low frequency sensor 38. FIG. 6 illustrates an alternative embodiment of the low frequency sensor 38 wherein a resistive film 76 is substituted for one or more of the substantially conductive plates 73. The resistive film 76 essentially functions the same as the resistor R3.

Figure 8:
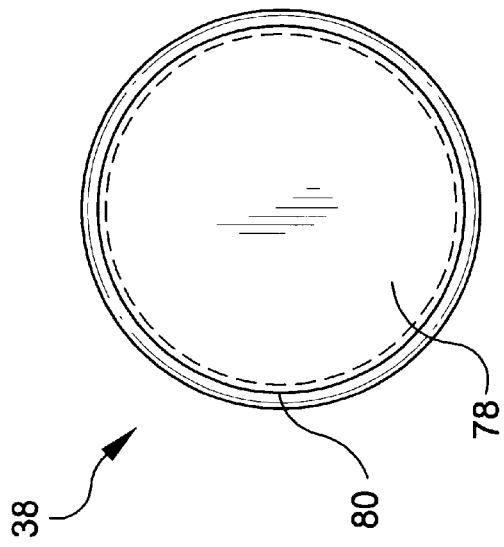
FIG. 8 is a bottom pictorial view of the third embodiment of the low frequency surface charge sensor formed in accordance with the present invention.
Figure 7:
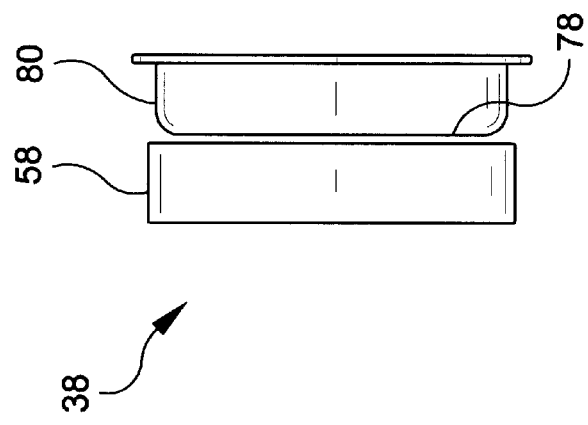
FIG. 7 is a side pictorial view of a third embodiment of the low frequency surface charge sensor formed in accordance with the present invention.

Alternatively, FIGS. 7 and 8 illustrate another embodiment of the low frequency sensor 38 in the shape of a cup including a resistive disk portion 78 and cylindrical resistive sidewalls 80 extending normally to the disk portion 78. Such a configuration can be made using a plastic form with a resistive coating. The cylindrical resistive sidewalls 80 enable the low frequency sensor 38 to respond to vertical, horizontal and radially polarized fields.

If the low frequency sensor 38 assumes the cup-shaped embodiment of FIGS. 7 and 8, then the resistive disk portion 78 is preferably disposed with its outer axial surface facing the lossy material 58 as illustrated in FIG. 7. If the low frequency sensor 38 assumes the flat embodiments of FIGS. 5 and 6, then the disk 74 is similarly positioned to face the lossy material 58 with one of its axial surfaces. The resistive film 76 of the disk 74 is preferably adjacent to the lossy material 58. In all embodiments, the lossy material is preferably sandwiched between the low frequency sensor 38 and the high frequency sensor 36 as illustrated in FIG. 3.

FIGS. 9 and 10 illustrate the mounting of the low frequency sensor 38 and the detector 40 on the printed circuit board 68. The detector 40 is electrically connected to the low frequency gain adjustment circuit 42, shown in FIG. 3, via the second flexible transmission line 70. It is preferable to mount the low frequency sensor 38 in close proximity with the detector 40 to minimize thermal and electrical noise developed between the low frequency sensor 38 and the detector 40, which would be amplified by the detector 40. In addition, if the low frequency sensor 38 is cup-shaped, placement of the detector 40 under the cup reduces the total amount of space required within the two-piece housing and, thus, the size of the personal electromagnetic radiation monitor.

The low frequency sensor 38 permits sensing of the electric field component in a low frequency range of about 100 kHz to about 1 GHz. The performance of the low frequency sensor 38 is not substantially degraded despite the lossy material 58 and the high frequency sensor 36 being located in close proximity to the low frequency sensor 38. The impedance of the lossy material 58 and the high frequency sensor 36 is significantly higher than the low frequency sensor 38 and, thus, does not significantly affect the performance of the low frequency sensor 38. Above 300 MHZ, as the response of the low frequency sensor 38 falls off, the response of the high frequency sensor 36 increases. The response of both the high frequency sensor 36 and the low frequency sensor 38 mesh in the region between about 300 MHZ and about 1 GHz. The response of the high frequency sensor 36 below about 300 MHZ is negligible. The response of the low frequency sensor above about 1 GHz is negligible. The mesh range of frequencies may be changed to accommodate different exposure standards.

One of the problems with measuring low frequency electric fields in the presence of a person is the perturbation of the field caused by the person. This problem is used advantageously by the low frequency sensor 38 to monitor hazardous radiation. The electric field of the electromagnetic radiation includes a radial component in a radial direction from the radiating antenna, and a vertical or horizontal component situated perpendicularly or orthogonally to the radial electric field component. Typically, the radiating antenna is a vertically disposed monopole antenna. The electric field of the radiated signal would, thus, include the radial and vertical components, "vertical" in the sense of being parallel to the length of the radiating antenna. In the region close to the radiating antenna, the majority of the electric field is directed radially.

Since radial electric fields are evident for only about ⅙ of a wavelength, the radial electric field component for broadcast bands between about 500 kHz and about 1.5 MHZ exist for between about 100 meters and about 33 meters, respectively, from the radiating antenna. At these distances, the strength of the radial electric field component is substantially equal to that of the vertical electric field component. Further detail regarding the strength of electric fields from the radiating antenna is provided in E. A. Wolff, *Antenna Analysis,* published by John Wiley and Sons, Inc., at page 27, which is incorporated herein by reference.

A surface charge is induced on the conductive surface of the low frequency sensor 38 by the radial electric field. The surface charge induces a displacement current given by the equation:

$$I = \epsilon_o (A\ dE/dt)$$

where

A=surface area of the conductive surface, $\epsilon_o$=permitivity of free space, $8.85 \times 10^{-12}$, and E=electric field strength in volts/meter.

The radial component of the electric field provides less of a contribution at a specific distance from the radiating antenna, as frequency increases. However, the low frequency sensor 38 still provides detection of hazardous levels of radiation. If a vertical or horizontal electric field is incident on the person, the electric fields induce a current in the person which creates a measurable, secondary radial electric field close to the surface of that person. Since the personal electromagnetic radiation monitor 10 is worn at the surface of the person, the secondary radial electric field produces a detectable response from the low frequency sensor 38. Thus, the low frequency sensor 38 responds to either the primary radial electric field radiating directly from the antenna or the secondary radial electric field created by the induced current in the person illuminated by the vertical or horizontal electric field. An analysis of the detection of the secondary radial electric field created by the induced current in the person for hazard warning purposes is described below.

The current distribution in a person illuminated by an electric field is substantially sinusoidal, as described in O. P.

Gandhi, *Currents Induced In A Human Being For Plane-Wave Exposure Conditions 0–50 MHZ And For RF Sealers,* IEEE Transactions on Biomedical Engineering, Vol. BME-33, No. 8 (August 1986), which is incorporated herein by reference. The person acts as a radiating antenna and creates a secondary radial electric field near the surface of the person. If current distribution in the person is sinusoidal, the equation for determining the radial electric field close to the surface of the person is given by:

$$E_y = \frac{J30Im}{y}\left((Z-H)\frac{e^{-jBR1}}{R1} + (Z+H)\frac{e^{jR2}}{R2} - 2Z\cos BH\frac{e^{-jr}}{r}\right)$$

where $E_y$=Radial electric field near the antenna,
Im=Maximum current amplitude,
H=Element length, $$B = \frac{2\pi}{\lambda},$$

J=$\sqrt{-1}$, and
$\lambda$=wavelength.

This equation is described in E. C. Jordan and K. G. Balmain, *Electromagnetic Waves and Radiating Systems,* 2nd edition, published by Prentice-Hall, Inc., at page 336, which is incorporated herein by reference.

Figure 11:
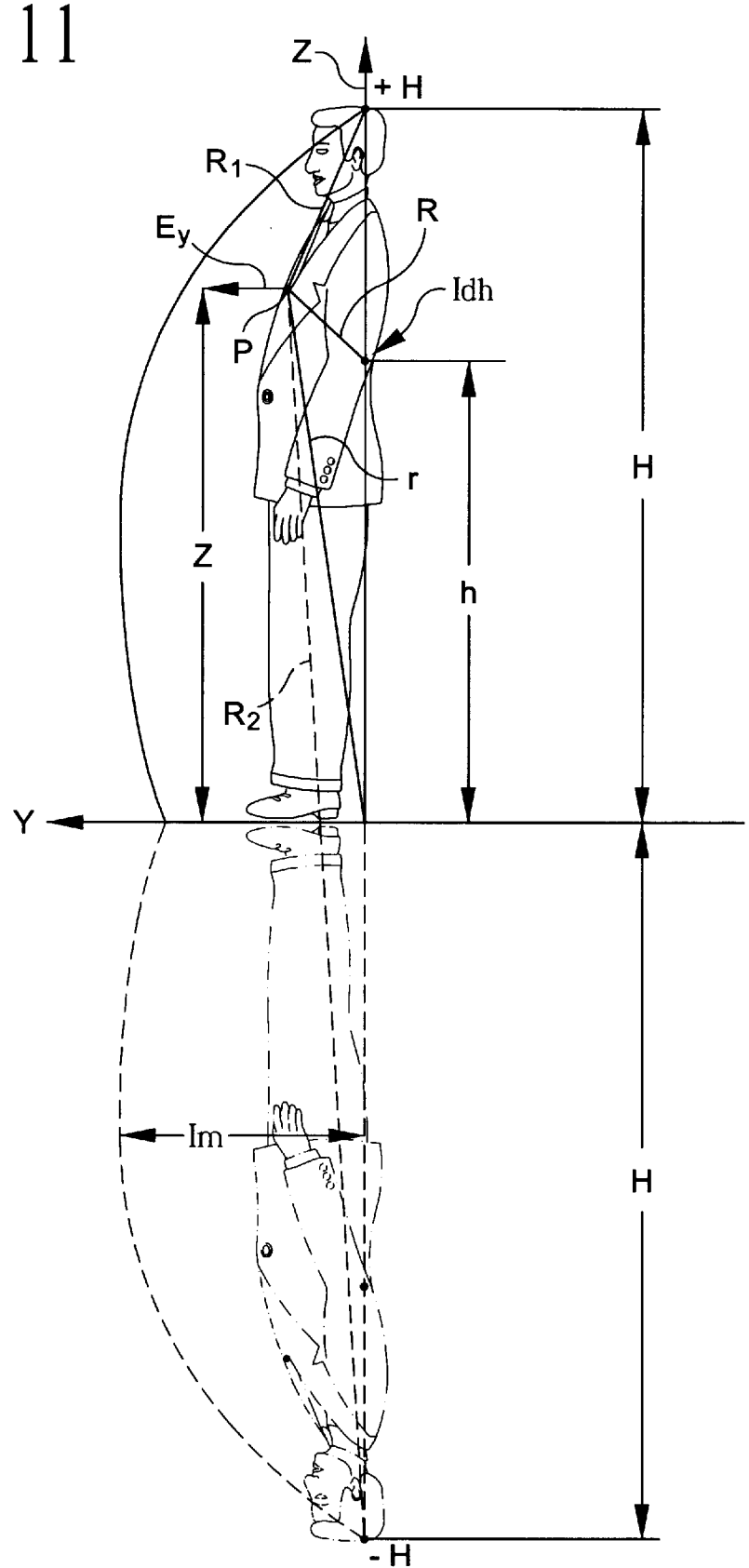
FIG. 11 is a pictorial representation of a person wearing the personal electromagnetic radiation monitor of the present invention illustrating dimensions and electric field vectors used in calculating the electric field radiated by the person when exposed to electromagnetic radiation.

FIG. 11 illustrates the radial electric field emanating from a person. Applying the equation described above to determine the secondary radial electric field, $E_y$, near the surface of the person, the maximum current amplitude, Im, occurs at the feet of the person. The element length, H, represents the height of a standard man, which is 175 cm. The variable y is the distance from the center of the person (which coincides with the Z axis) to the sensor 100 (located at point P), which is estimated to be about 25 cm. The variable z relates to the height above ground where the personal monitor is located, which is approximately 1.3 meters distance from the floor to where the sensor is on the person. The variable R1 is the distance from the top surface of the head of the person wearing the monitor to where the sensor is located, which is estimated to be about 0.515 meters. The variable R is the distance from the feet of the person to where the sensor is located, which is about 1.32 meters. The variable R2 is the distance from where the sensor is located to the image of the top surface of the head of the person, and is estimated to be about 3.06 meters. Thus, the radial electric field created by the current induced in the person wearing the monitor and exposed to electromagnetic radiation may be calculated.

The current, including the maximum current, Im, induced in the person is described in H. Korniewicz, *The First Resonance of a Grounded Human Being Exposed to Electric Fields,* IEEE Transactions on Electromagnetic Compatability, Vol. 37, No. 2 (May 1995), which is incorporated herein by reference. The previously mentioned article by O. P. Gandhi describes the effect on the induced current by the person wearing shoes versus frequency.

Human resonance occurs at about 40 MHZ. At this frequency, the radial electric field is more than 2.5 times greater than the illuminating vertical or horizontal electric field and thus may be detected. The radial electric field is significant and equal to the illuminating vertical or horizontal electric field over a wide frequency range. In summary, secondary radial electric fields at the surface of the person's body who is wearing the personal monitor of the present invention do indeed exist and may be detected to determine a hazardous condition.

Figure 12:
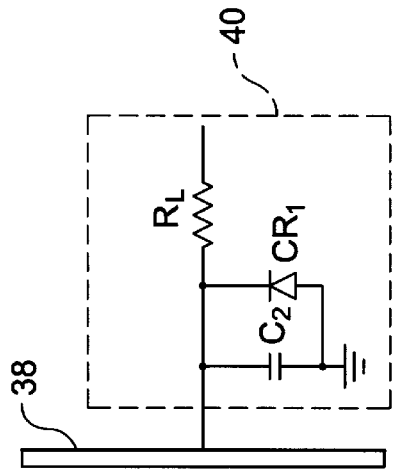
FIG. 12 is a schematic diagram of the low frequency surface charge sensor and a first embodiment of the detector formed in accordance with the present invention.

FIGS. 12 and 13 are schematic diagrams of alternative embodiments of the detector 40. The detector 40 includes a diode CR1 responsive to current created by the radial electric field detected by the low frequency sensor 38. The diode CR1 generates a direct current (dc) voltage signal proportional to the square of the detected electric field. The low frequency sensor 38 functions as a capacitor, the impedance, Z, of which is inversely proportional to the frequency and, thus, inversely proportional to dE/dt. Thus, the output of the diode CR1 is substantially independent of frequency over a large frequency range.

As illustrated in FIGS. 12 and 13, a capacitor C2 may be added in parallel with the diode CR1 between the low frequency sensor 38 and ground to form a capacitor divider network with the capacitance of the low frequency sensor 38. This capacitor C2 is added in order to adjust the sensitivity of the diode CR1. The capacitor C2 functions to flatten the response of the detector 40. In effect, the capacitor C2 and the capacitance of the low frequency sensor 38 become a frequency independent attenuator. Alternatively, it is envisioned that in some applications the intrinsic capacitance of the diode CR1 may be used to shape the response of the low frequency sensor 38 rather than using a discrete capacitor.

FIG. 13 illustrates another embodiment of the detector 40, which includes an ANSI shaping circuit, which substantially conforms the response of the personal electromagnetic radiation monitor conforms to the ANSI or IEEE standard C95.1–1992. The ANSI shaping circuit of the detector circuit includes a resistor R3 which is coupled to the low frequency sensor 38, and which may be in the form of a discrete resistor or the intrinsic resistance of the low frequency sensor 38. The other end of resistor R3 is coupled to the series connection of resistor R1, capacitor C1 and the parallel arrangement of capacitor C3, inductor L1 and resistor R2. The other end of this parallel arrangement is coupled to ground. The series arrangement of resistor R1, capacitor C1 and the parallel arrangement of capacitor C3, inductor L1 and resistor R2 are coupled in parallel with capacitor C2 and across diode CR1. An anode of CR1 is grounded and a cathode of CR1 is connected to one end of resistor R3.

Figure 14:
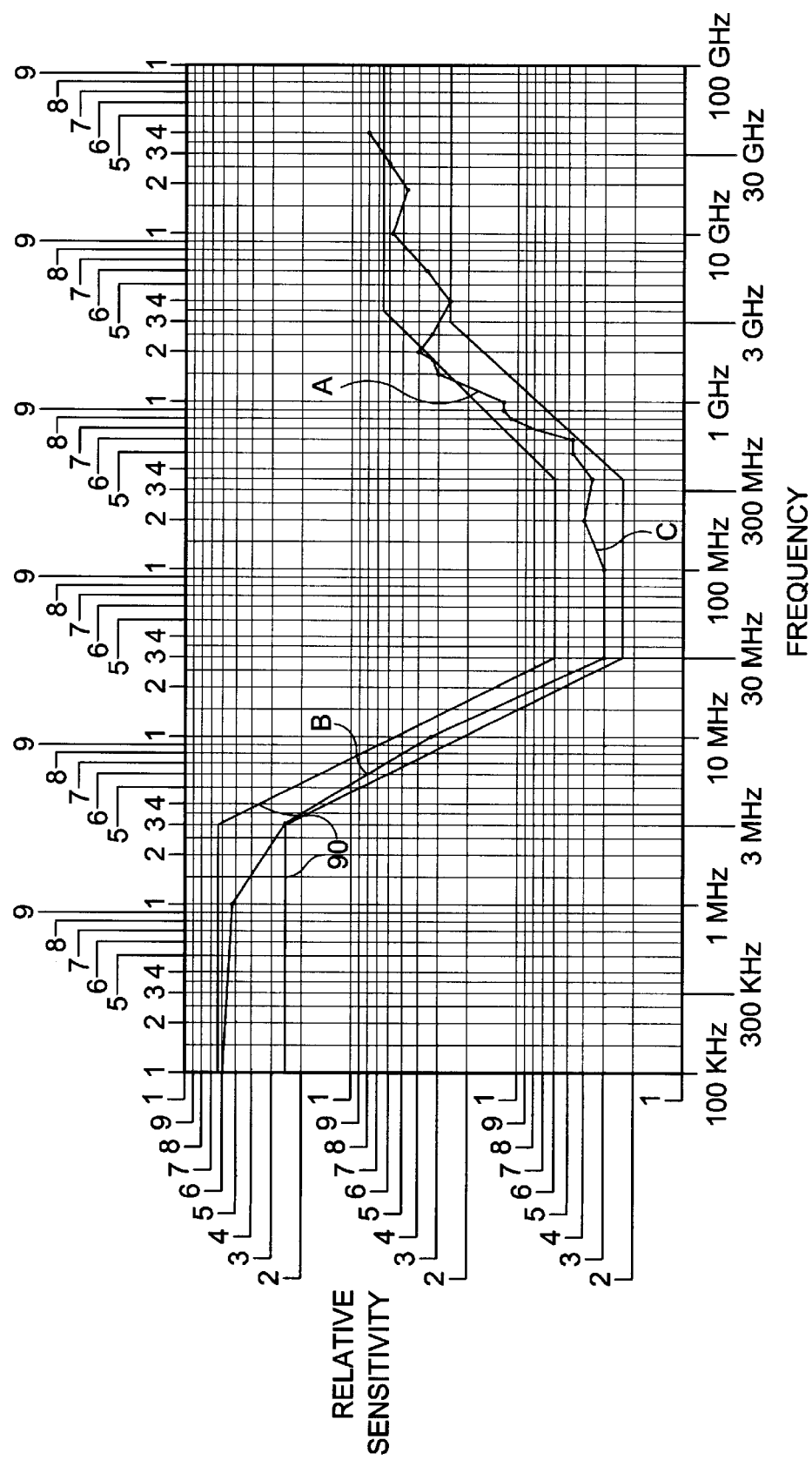
FIG. 14 is a graph of relative sensitivity as a function of frequency of the personal electromagnetic radiation monitor formed in accordance with the present invention, the frequency scale being logarithmically presented.

FIG. 14 illustrates a logarithmic graph of relative sensitivity versus frequency for the personal electromagnetic radiation monitor 10 of FIG. 3 incorporating the circuit illustrated in FIG. 13. The straight lines indicate a range conforming to ANSI standards, and a plotted line substantially between the straight lines indicates the frequency response for the circuit of FIG. 13. Resistor R3 and the inherent capacitance of the low frequency sensor 38 provides a roll off in the frequency response of the low frequency sensor 38 above about 300 MHZ, as shown in FIG. 14 and designated by reference letter A. The combination of resistor R1, capacitor C1 and the parallel arrangement of capacitor C3, inductor L1 and resistor R2 provide a lower frequency roll off below about 30 MHZ, shown in FIG. 14 and designated by reference letter B. Capacitor C2 across detector diode CR1 provides a flattened response between about 30 MHZ and about 300 MHZ, shown in FIG. 14 and designated by reference letter C. The flat response below about 3 MHZ is determined by capacitor C1. Variations in the components and/or the values of the components described above will provide differently shaped responses.

As mentioned previously, the detector 40 is mounted on the printed circuit board 68 under the low frequency sensor 38 and is connected to additional electronic circuitry on a main printed circuit board (not shown) through the second flexible transmission line 70. The low frequency gain adjustment circuit 42, high frequency gain adjustment circuit 44, summing circuit 46, threshold reference 50, comparator 48, alarm indication circuit 52, an optional translation circuit 84 and an optional meter 82 are preferably mounted on the main printed circuit board (not shown), which is fixably mounted within the two-piece housing 12.

Referring to FIG. 3, when the low frequency sensor 38 detects an induced current, the detector 40 provides a corresponding voltage in response thereto to the low frequency gain adjustment circuit 42. The low frequency gain adjustment circuit 42 attenuates, amplifies or passes the voltage to the summing circuit 46. The summing circuit 46 can include any of a number of configurations of operational amplifiers or transistors well known in the art such as those described in R. Dorf, Electrical Engineering Handbook, published by CRC Press (1993), pp. 619–694, which is incorporated herein by reference.

The summing circuit 46 provides a sum of the applied signals from the low frequency gain adjustment circuit 42 and the high frequency gain adjustment circuit 44 and outputs a summed signal to the comparator 48. The comparator 48 has one of its inputs, such as a non-inverting input of an operational amplifier, coupled to the summing circuit 46 and has its other input, such as an inverting input of the operational amplifier, coupled to a preselected or adjustable reference voltage Vr (which may be ground) from the threshold reference 50. The output of the comparator 48 is provided to an alarm indication circuit 52, which will be triggered when the voltage on the non-inverting input of the comparator 48 exceeds the reference voltage Vr on the inverting input and the output signal changes state. The alarm indication circuit 52 provides a visual, audible or other human-detectable indication to the wearer of potential exposure to dangerous electromagnetic radiation.

Figure 15:
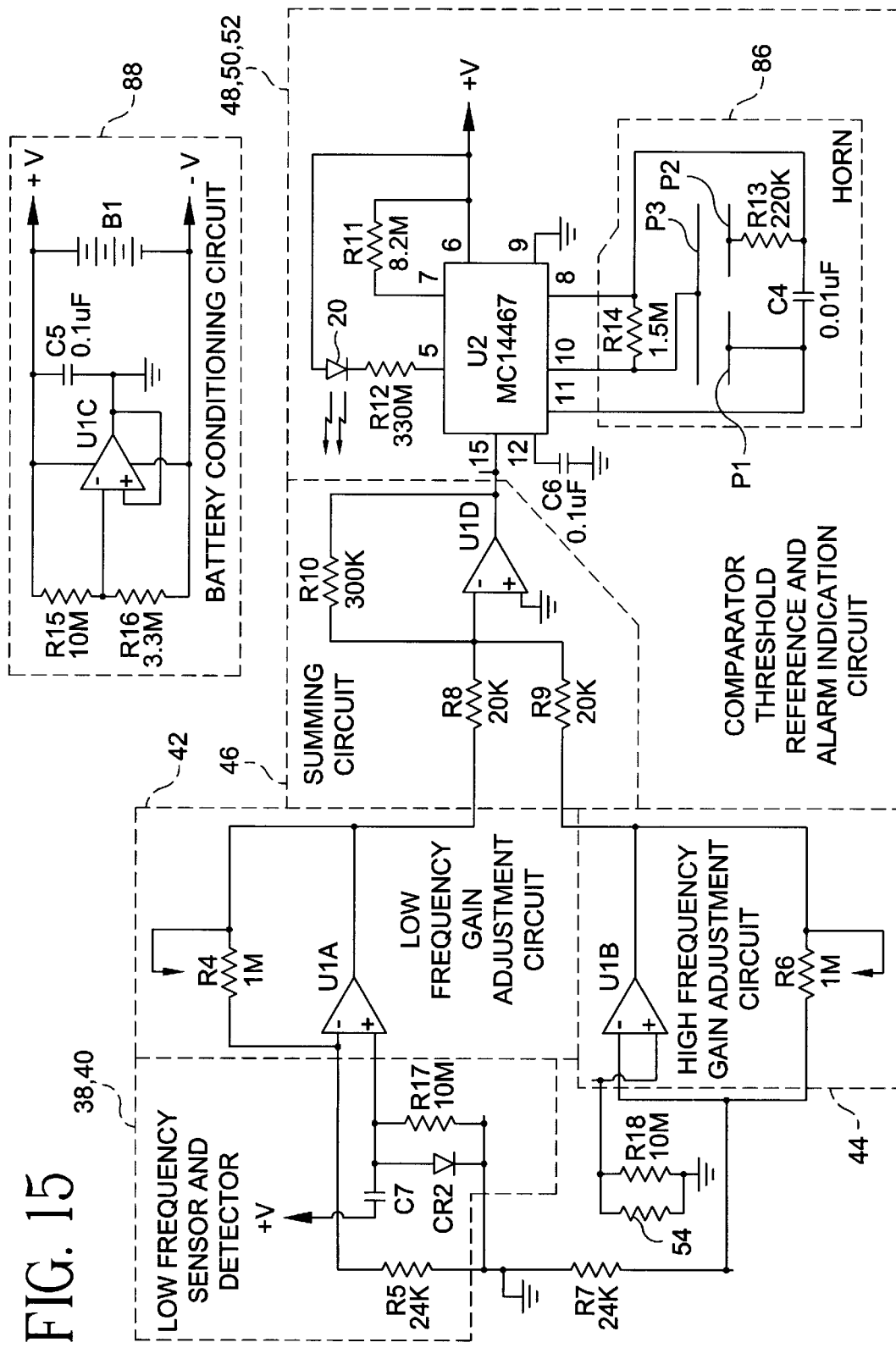
FIG. 15 is a schematic diagram of the personal electromagnetic radiation monitor formed in accordance with the present invention.

FIG. 15 is a schematic diagram of the personal electromagnetic radiation monitor illustrated as a block diagram in FIG. 3. The low frequency sensor and detector 38, 40 include a diode CR2 and a 10M ohm resistor R17 connected in parallel across a non-inverting input of operational amplifier U1A. The low frequency sensor 38 is substantially equivalent to the diode CR2. The low frequency sensor and detector 38, 40 also include a capacitor C7 connected in series between the non-inverting input of operational amplifier U1A and +V. The high frequency sensor 54 is illustrated as an equivalent resistor connected in parallel with a 10 M ohm resistor R18 across a non-inverting input of the operational amplifier U1B and ground.

The low frequency gain adjustment circuit 42 includes the operational amplifier U1A and a 1 M ohm variable resistor R4. A 24 k ohm resistor R5 in the low frequency sensor and detector 38, 40 is connected in series between an inverting input of the operational amplifier U1A and ground. The 1 M ohm variable resistor R4 is connected in series between the non-inverting input of the operational amplifier U1A and an output of the operational amplifier U1A. The operational amplifier U1A functions to vary the gain of the signal from the low frequency sensor according to the adjustable resistor R4 setting.

The high frequency gain adjustment circuit 44 includes an operational amplifier U1B and a 1 M ohm variable resistor R6. A 24 k ohm resistor R7 is connected in series between an inverting input of the operational amplifier U1B and ground. The operational amplifier U1B functions to vary the gain of the signal from the high frequency sensor 54 according to the adjustable resistor R6 setting.

The summing circuit 46 includes an operational amplifier U1D, two 20 k ohm resistors R8 and R9 and a 300 k ohm resistor R10. The 20 k ohm resistor R8 is connected in series between an inverting input of the operational amplifier U1D and the output of the operational amplifier U1A. The 20 k ohm resistor R9 is connected in series between the inverting input of the operational amplifier U1D and the output of the operational amplifier U1B. A non-inverting input of the operational amplifier U1D is coupled to ground. The 300 k ohm resistor R10 is connected in series between the inverting input of the operational amplifier U1D and the output of the operational amplifier U1D. The operational amplifier U1D functions to sum the outputs from the operational amplifiers U1A and U1B.

The comparator, threshold reference and alarm indication circuit 48, 50, 52 include an MC14467 integrated circuit U2 (a multifunction integrated circuit including an internal threshold reference, manufactured by Motorola Corp.) or its equivalent, an 8.2 M ohm resistor R11, a 330 ohm resistor R12, a horn 86, an LED 20 and a 0.1 $\mu$F capacitor C4. The horn 82 is a crystal driven oscillator having feedback capacitance, which includes a plate P1, a plate P2, a plate P3, a 220 0k ohm resistor R13, a 1.5 M ohm resistor R14, and a 0.01 $\mu$F capacitor C6. The LED 20 and 330 ohm resistor R12 are connected in series between pin 5 of integrated circuit U2 and +V. The 330 M ohm resistor R12 is coupled to an anode of the LED 20. The 8.2 M ohm resistor R11 is connected in series between pin 7 and pin 6 of integrated circuit U2. Pin 6 of U2 is coupled to +V. Pin 15 of U2 is coupled to the output of the operational amplifier U1D. The 0.1 $\mu$F capacitor C6 is connected in series between pin 12 of circuit U2 and ground. Pin 9 of circuit U2 is coupled to ground. The 0.01 $\mu$F capacitor C4 and the 220 k ohm resistor R13 are connected in series between plate P1 and plate P2. Pin 11 of integrated circuit U2 is also coupled to plate P1. The 220 k ohm resistor R13 is connected in series between plate P2 and pin 8 of U2. The 0.01 $\mu$F capacitor C4 is connected in series between plate P1 and pin 8 of U2. The 1.5 M ohm resistor R14 is connected in series between pin 10 and pin 8 of U2. Pin 10 of U2 is coupled to plate P3. The MC14467 circuit compares the output of the operational amplifier U1D to a predetermined threshold voltage and if the output of operational amplifier U1D is greater, the LED 20 and horn 86 are illuminated and energized, respectively.

A battery conditioning circuit 88 includes a battery B1, a 0.1 $\mu$F capacitor C5, a 10 M ohm resistor R15, a 3.3 M ohm resistor R16 and an operational amplifier UIC. An inverting input of the operational amplifier U1C is coupled to an output of the operational amplifier U1C and ground. The 3.3 M ohm resistor R16 is connected in series between a non-inverting input of operational amplifier U1C and −V. The 10 M ohm resistor R15 is connected in series between an inverting input of operational amplifier U1C and +V. The 0.01 $\mu$F capacitor C5 is connected in series between the output of the operational amplifier U1C and +V. The battery B1 is connected in series from +V to −V. A positive terminal of the battery B1 is coupled to +V, and a negative terminal of the battery B1 is coupled to −V. The battery conditioning circuit 88 provides low impedance dual output voltages from a single battery.

Although separate high and low frequency gain adjustment circuits are illustrated, either one or both could be omitted or shared while still remaining within the scope of the present invention.

Alternatively, the personal electromagnetic radiation monitor could be used as a meter, rather than a monitor as illustrated by dashed lines in FIG. 3. The meter 82 is coupled to the optional translation circuit 84, such as an amplifier, which is interposed between the meter 82 and the low frequency gain adjustment circuit 42, high frequency gain adjustment circuit 44 and/or summing circuit 46 to transform outputs from these circuits into a signal appropriate for driving the meter 82. The meter 82 provides a measurement of the signal strength or induced current by the high frequency, low frequency or a sum of the high and low frequency components of electromagnetic radiation in the area of the meter 82.

The personal electromagnetic radiation monitor 10 detects radiation in the desired range between about 100 kHz and about 100 GHz with substantially no degradation in performance or interference between components responsible for detecting high and low frequency bands within the desired frequency range. The high frequency sensor 36 detects electromagnetic radiation in the range between about 300 MHZ and about 100 GHz, and is substantially immune to scattering caused by the wearer's body. The low frequency sensor 38 detects electromagnetic radiation in the range between about 100 kHz and about 1 GHz using scattering caused by the person to create a secondary radial electric field component, which is detected by the particular shape of the low frequency sensor 38. The response of the low frequency sensor 38 is proportional to the magnitude of the electric field originating from the radiating source or being induced in the person, and is substantially frequency independent.

The personal electromagnetic radiation monitor 10 may be worn on the clothing of the person. The wide bandwidth of the monitor 10 and independence of polarization make the monitor 10 suitable for use under a multitude of conditions. The alarm indication circuit 52 provides both audible, visual and/or human-detectable indication of hazardous conditions.

The personal electromagnetic radiation monitor 10 is well suited for use in noisy environments. The earplug assembly 26 is non-electrically conductive to prevent injury to the wearer and misreadings or damage to the electronic circuitry of the monitor 10 due to absorbed radiation.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. An electromagnetic radiation sensor assembly for use in an electromagnetic radiation monitor, which comprises:
    a low frequency sensor;
    a high frequency sensor; and
    a lossy material interposed between the low frequency sensor and the high frequency sensor.

2. A wideband sensor assembly for use in an electromagnetic radiation monitor, which comprises:
    a surface charge sensor, the surface charge sensor sensing low frequency electromagnetic radiation;
    a high frequency sensor, the high frequency sensor sensing high frequency electromagnetic radiation; and
    a lossy material, the lossy material being interposed between the low frequency sensor and the high frequency sensor.

3. A wideband sensor assembly for use in an electromagnetic radiation monitor as defined by claim 2, wherein the high frequency sensor includes a planar array of spaced apart thermocouples.

4. A wideband sensor assembly for use in an electromagnetic radiation monitor as defined by claim 3, wherein the high frequency sensor includes a plurality of antenna elements, each of the plurality of antenna elements including a longitudinal axis, the longitudinal axis of each of the plurality of antenna elements being disposed in a plane at substantially 90 degrees relative to the longitudinal axis of at least one adjacent antenna element, each of the plurality of antenna elements including a portion of the planar array of spaced apart thermocouples positioned along the longitudinal axis, each of the plurality of antenna elements including a plurality of conductive elements arranged substantially perpendicularly to the longitudinal axis and spaced apart from each other along the longitudinal axis, at least a portion of the planar array of spaced apart thermocouples being positioned between adjacent conductive elements.

5. A wideband sensor assembly for use in an electromagnetic radiation monitor as defined by claim 2, wherein the high frequency sensor includes a planar arrangement of resistive dipoles.

6. A wideband sensor assembly for use in an electromagnetic radiation monitor as defined by claim 2, wherein the lossy material is progressively more conductive as the lossy material is traversed in a direction from the high frequency sensor to the surface charge sensor.

7. A wideband sensor assembly for use in an electromagnetic radiation monitor as defined by claim 2, wherein the lossy material exhibits substantially constant conductivity as the lossy material is traversed in a direction from the high frequency sensor to the surface charge sensor.

8. A wideband sensor assembly for use in an electromagnetic radiation monitor as defined by claim 2, wherein the lossy material includes a plurality of laminated layers, at least two of the plurality of laminated layers having different conductivities.

9. A wideband sensor assembly for use in an electromagnetic radiation monitor as defined by claim 2, further comprising a non-conductive insulation sheet positioned between the high frequency sensor and the lossy material.

10. A wideband sensor assembly for use in an electromagnetic radiation monitor as defined by claim 2, wherein the surface charge sensor has a substantially planar shape.

11. A wideband sensor assembly for use in an electromagnetic radiation monitor as defined by claim 2, wherein the surface charge sensor includes a resistive film situated on a surface of the surface charge sensor.

12. A wideband sensor assembly for use in an electromagnetic radiation monitor as defined by claim 2, wherein the surface charge sensor is substantially cup-shaped and includes a disk portion and a cylindrical sidewall portion extending substantially perpendicularly from the disk portion.

13. A wideband sensor assembly for use in an electromagnetic radiation monitor as defined by claim 2, wherein the surface charge sensor is at least partially resistive.

14. A wideband sensor assembly for use in an electromagnetic radiation monitor as defined by claim 2, wherein the surface charge sensor is substantially conductive.

15. A monitor to be worn by a person to indicate electromagnetic radiation, the electromagnetic radiation including high frequency radiation and low frequency radiation, the low frequency radiation including a primary radial electric field and a vertical or horizontal electric field, the vertical or horizontal electric field inducing a displacement current in the person, the displacement current generating a secondary radial electric field from the person, the monitor comprising:

a low frequency sensor assembly, the low frequency sensor assembly including a surface charge sensor and a detector, the surface charge sensor being responsive to at least one of the primary radial electric field and the secondary radial electric field, the surface charge sensor outputting a first signal in response to at least one of the primary radial electric field and the secondary radial electric field, the detector being responsive to the first signal and outputting a detected signal in response to the first signal;

a high frequency sensor, the high frequency sensor being responsive to the high frequency radiation and outputting a second signal in response to the high frequency radiation;

a lossy material, the lossy material being disposed between the high frequency sensor and the surface charge sensor;

a summing circuit, the summing circuit being responsive to the detected signal and the second signal, the summing circuit outputting a summed signal indicative of a sum of the detected signal and the second signal; and a comparator, the comparator being responsive to the summed signal and a threshold signal, the comparator outputting an alarm signal indicative of a radiation alarm condition if the summed signal is greater than the threshold signal.

16. A monitor as defined by claim 15, further including a low frequency gain adjustment circuit responsive to the detected signal, the detected signal having an amplitude, the low frequency gain adjustment circuit being responsive to the detected signal, the low frequency gain adjustment circuit changing the amplitude of the detected signal.

17. A monitor as defined by claim 15, further including a high frequency gain adjustment circuit responsive to the second signal, the second signal having an amplitude, the high frequency gain adjustment circuit being responsive to the second signal, the high frequency gain adjustment circuit changing the amplitude of the second signal.

18. A monitor as defined by claim 15, further including an alarm indication device responsive to the alarm signal, the alarm indication device providing a human-detectable indication of the radiation alarm condition.

19. A monitor as defined by claim 15, wherein the lossy material is progressively more conductive as the lossy material is traversed from the high frequency sensor to the surface charge sensor.

20. A monitor as defined by claim 15, wherein the lossy material exhibits substantially constant conductivity as the lossy material is traversed from the high frequency sensor to the surface charge sensor.

21. A monitor as defined by claim 15, wherein the surface charge sensor at least partially defines an interior space; and wherein the detector is mounted within the interior space of the surface charge sensor.

22. A monitor as defined by claim 15, wherein the high frequency sensor includes a planar array of spaced apart thermocouples.

23. A monitor as defined by claim 22, wherein the high frequency sensor includes a plurality of antenna elements, each antenna element having a longitudinal axis, the longitudinal axis of each antenna element being disposed in a plane at substantially 90 degrees relative to the longitudinal axis of adjacent antenna elements, each antenna element including a portion of the array of thermocouples positioned along the longitudinal axis and conductive elements arranged substantially perpendicularly to and spaced apart from each other along the longitudinal axis, the thermocouples being positioned between adjacent conductive elements.

24. A monitor as defined by claim 15, wherein the high frequency sensor includes a planar arrangement of resistive dipoles.

* * * * *